US009595826B2

(12) United States Patent
Brombach et al.

(10) Patent No.: US 9,595,826 B2
(45) Date of Patent: Mar. 14, 2017

(54) PROTECTION ELEMENT HAVING INTEGRATED DISTANCE PROTECTION WITH REAL TIME ADAPTATION OF THE TRIGGER TIME FOR DETECTING AND SEPARATING HIGH IMPEDANCE ERRORS IN MESHED NETWORKS

(71) Applicant: Airbus Operations GmbH, Hamburg (DE)

(72) Inventors: Johannes Brombach, Hamburg (DE); Arno Luecken, Hamburg (DE); Detlef Schulz, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 371 days.

(21) Appl. No.: 14/212,683

(22) Filed: Mar. 14, 2014

(65) Prior Publication Data

US 2014/0240881 A1    Aug. 28, 2014

Related U.S. Application Data

(63) Continuation of application No. PCT/EP2012/004015, filed on Sep. 25, 2012.
(Continued)

(51) Int. Cl.
*H02H 3/00*      (2006.01)
*H02H 7/22*      (2006.01)
(Continued)

(52) U.S. Cl.
CPC .............. *H02H 7/222* (2013.01); *H02H 3/40* (2013.01); *H02H 7/28* (2013.01); *G01R 31/085* (2013.01);
(Continued)

(58) Field of Classification Search
USPC ....................................... 361/62–69
See application file for complete search history.

(56) References Cited

U.S. PATENT DOCUMENTS

| 4,321,681 A | * | 3/1982 | Sackin | ...................... H02H 3/40 361/68 |
| 7,720,619 B2 | * | 5/2010 | Hou | ...................... H02H 1/0015 702/58 |

FOREIGN PATENT DOCUMENTS

| DE | 1807253 | 5/1970 |
| DE | 2709063 | 2/1978 |

OTHER PUBLICATIONS

Algorithmic-Knowledge-Based Adaptive Coordination in Transmission Protection, Ordu PRG Naorduna et al., Jan. 1, 2003.
International Search Report, Nov. 28, 2012.

* cited by examiner

*Primary Examiner* — Danny Nguyen
(74) *Attorney, Agent, or Firm* — Greer, Burns & Crain Ltd.

(57) ABSTRACT

A protection element for a meshed energy supply network of a means of transport, in particular of an aircraft, a meshed energy supply network having such protection elements, a method for protecting such a meshed energy supply network and a computer program for executing the method. The protection element comprises a control unit, which is formed to deduce a trigger time value from a detected fault impedance value of a network error that has occurred in the energy supply network and to adapt the trigger time value in the event of a subsequent change in the fault impedance value of the network error, and a separation unit for interrupting a connection between the protection element and the network error depending on the trigger time value.

14 Claims, 10 Drawing Sheets

Related U.S. Application Data

(60) Provisional application No. 61/540,016, filed on Sep. 28, 2011.

(51) Int. Cl.
    *H02H 3/40*     (2006.01)
    *H02H 7/28*     (2006.01)
    *H02H 7/26*     (2006.01)
    *G01R 31/08*     (2006.01)
    *H02H 7/30*     (2006.01)

(52) U.S. Cl.
    CPC ............... *H02H 7/26* (2013.01); *H02H 7/262* (2013.01); *H02H 7/30* (2013.01)

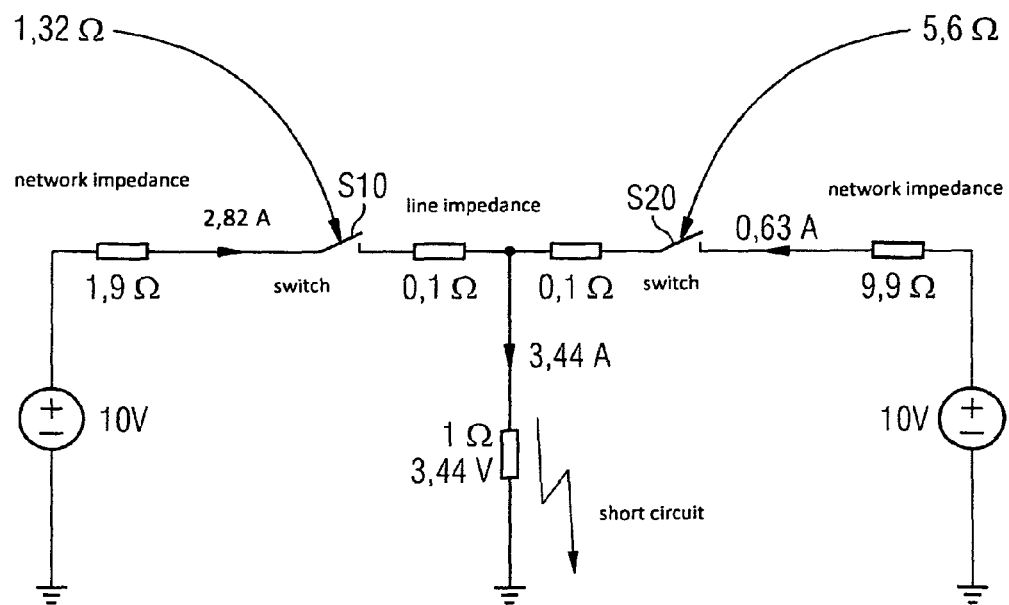
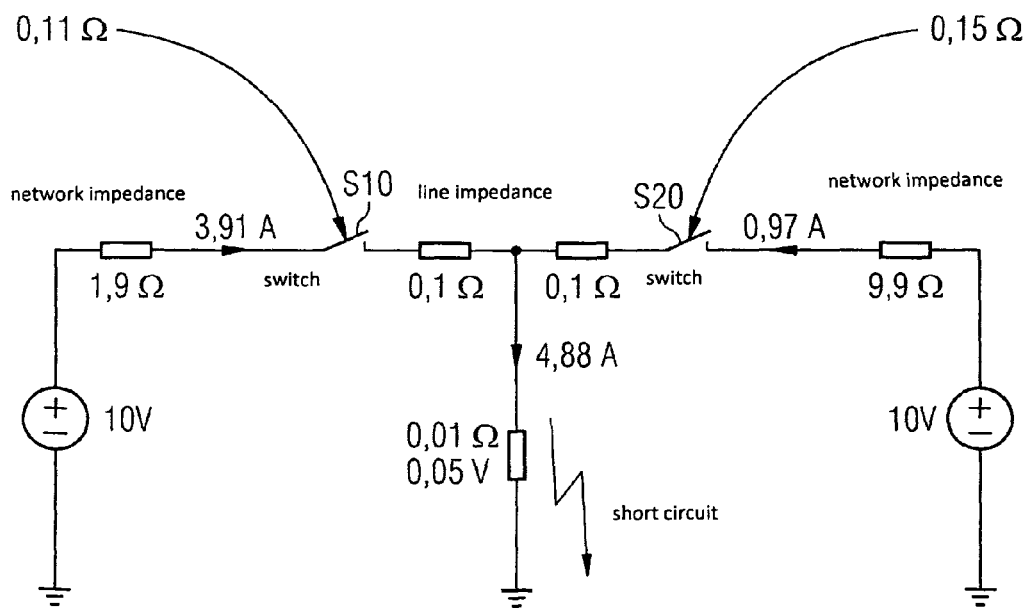

PROTECTION ELEMENT HAVING INTEGRATED DISTANCE PROTECTION WITH REAL TIME ADAPTATION OF THE TRIGGER TIME FOR DETECTING AND SEPARATING HIGH IMPEDANCE ERRORS IN MESHED NETWORKS

CROSS-REFERENCES TO RELATED APPLICATIONS

This application is a continuation of International Application PCT/EP2012/004015 filed Sep. 25, 2012, designating the United States and published on Apr. 4, 2013 as WO 2013/045075. This application also claims the benefit of the U.S. Provisional Application No. 61/540,016, filed on Sep. 28, 2011, and of the German patent application No. 10 2011115243.5 filed on Sep. 28, 2011, the entire disclosures of which are incorporated herein by way of reference.

BACKGROUND OF THE INVENTION

The present invention relates to a protection element for a meshed energy supply network of a means of transport, in particular of an aircraft, a meshed energy supply network with such protection elements, a method for protecting such a meshed energy supply network and a computer program for executing the method.

Energy supply networks (also called on-board networks in means of transport) are used in a means of transport such as e.g., an aircraft, a ship, a submarine, a bus or a train to supply electrical energy to electrical recipients (consumers). Often the totality of all electrical components in the means of transport is described as the on-board network. The electrical components include, among other things, the cabling, control apparatuses, sensors, display elements (such as warning and indicator lamps, displays), actuators (such as electric motors, lamps and lighting systems), bus systems, energy stores (such as batteries and accumulators) and generators. Conventional on-board networks are normally constructed in a star shape in means of transport such as aircraft, i.e., each consumer is normally supplied with electrical energy from the generator or generators by its own line. To safeguard the conventional energy supply networks, each line to a consumer is often protected separately by overcurrent protection (e.g., a fuse). Higher-level supply lines (so-called feeder lines) are likewise protected by correspondingly larger fuses. If a fault (e.g., an earth fault) occurs in a supply line, the pertinent fuse responds and the consumer is separated from the energy supply network. Networks constructed in a star shape are reliably safeguarded thereby.

The demand for electrical energy in means of transport, such as aircraft, has increased steadily in the last few decades. This is due among other things to the fact that aircrafts, for example, are becoming ever bigger, electrical loads and functions have been added that replace pneumatic or hydraulic systems, and additional electrical consumers have been added due to growing comfort requirements of the passengers. Consideration is being given accordingly to using meshed energy supply networks (on-board networks) increasingly in means of transport, such as aircraft. A meshed energy supply network normally has a plurality of network nodes, which are each connected to one or more other network nodes. These meshed network structures are especially suitable for networks of high load densities, but can also be used in networks of low load density.

For the selective network protection of meshed energy supply networks in means of transport, such as aircraft, so-called distance or impedance protection is offered. In this, simple switches are used that in the event of a network error can separate the network error from the rest of the network. The conventional selective network protection system is constructed in a decentralized manner, i.e., no communication is necessary between the switches. For each switch, depending on the quotient of voltage and current following the occurrence of the fault, i.e., from the related impedance, a fixed trigger time is determined at which the switch opens (triggers) and thereby interrupts its connection to the network error. The impedance determined is dependent in this case on the line impedance and the length of the line to the network error. The greater the impedance, the greater also the trigger time. The result of this is that switches close to the fault trigger faster on account of the smaller impedance than switches remote from the fault with a correspondingly greater impedance. Due to the staggered triggering of the switches, the fault is separated, i.e., isolated from the rest of the network.

SUMMARY OF THE INVENTION

An object of the present invention is to provide a protection element and a method for protecting a meshed energy supply network of a means of transport, in particular of an aircraft, a meshed energy supply network with such protection elements and a computer program for executing the method, by means of which a reliable and efficient protection of the energy supply network is guaranteed.

The protection element according to the invention for a meshed energy supply network of a means of transport, in particular of an aircraft, comprises a control unit and a separation unit. The control unit is adapted to deduce a trigger time value from a determined fault impedance value of a network error that has occurred in the energy supply network and to adapt the trigger time value in the event of a subsequent change in the fault impedance value of the network error. The separation unit is adapted to interrupt a connection between the protection element and the network error depending on the trigger time value.

The impedance occurring at the protection element in case of a fault is to be understood under the concept of fault impedance/the fault impedance value.

The control unit may comprise an arithmetic unit or a processor, such as a microprocessor or a microcontroller, or be formed therefrom. Irrespective of the precise configuration of the control unit, a previously determined fault impedance value of the network error that has occurred in the energy supply network can be supplied to the control unit. From the fault impedance value supplied, the control unit can deduce an initial trigger time value. If a changed fault impedance value is subsequently supplied to the control unit, for example, the control unit can deduce a changed trigger time value from the changed fault impedance value and replace the initial trigger time value with the changed trigger time value.

The separation unit may have a switching element, such as an electrical, electromechanical or electronic switch (e.g., a semiconductor switch like a transistor) or be formed therefrom for interrupting the connection. The separation unit can be triggered, for example, by a trigger, control or actuation signal supplied by the control unit. Irrespective of the precise configuration of the separation unit, the separation unit may interrupt the connection between the protection element and the network error, e.g., by opening the switching element, at a time that is based on the trigger time value or corresponds to this.

The control unit may further be adapted to increase an actual time value periodically following occurrence of the network error. The actual time value may indicate the real time that has elapsed since occurrence of the network error. The control unit may compare the trigger time value, e.g., the deduced (unadapted) or adapted trigger time value, periodically with the actual time value, for example. If it is detected by the control unit that the trigger time value is smaller than the actual time value, the control unit can instruct the separation unit to interrupt the connection. For example, the control unit can transmit a trigger signal to this effect to the separation unit, which then, in reaction to the trigger signal, interrupts the connection, e.g., by opening the switching element. The network error can be separated from the rest of the energy supply network by interruption of the connection. The network error can be a ground fault or short circuit through a line, connection or cable direction ground/earth.

If the control unit determines that the trigger time value is not smaller than the actual time value, the connection is in particular not interrupted, i.e., the separation unit does not in this case receive any trigger signal from the control unit, for example. If the trigger time value is compared periodically with the actual time value, it is conceivable that the control unit adapts the trigger time value in the event of a subsequent change in the fault impedance value of the network error and compares it periodically with the actual time value until it is determined that the trigger time value is smaller than the actual time value.

The actual time value can be reset by the control unit if no further network error is detected, i.e., if the network error has been separated.

According to a specific configuration, the protection element may also have a determination unit. According to this configuration, the determination unit is adapted for example to deduce the fault impedance value of the network error from a voltage-current relationship. For example, with the aid of a measuring unit connected to the determination unit or incorporated in this, the voltage and the current at the protection element (e.g., the voltage drop between the protection element and ground and the current flowing through the protection element) can be measured. From the measured voltage and the measured current, the fault impedance/fault impedance value may be determined by the determination unit by dividing the measured voltage by the measured current. Following determination of the fault impedance value, the determination unit may forward the fault impedance value determined to the control unit, which may then determine the trigger time value of the protection element from this.

Generally speaking, the determination unit may be adapted to determine the fault impedance value of the network error from the voltage applied at the protection element (the voltage between protection element and ground) and the current flowing through the protection element.

With the aid of the protection element it is possible, e.g., directly after it has been recognized that a network error has occurred in the energy supply network, to deduce an initial trigger time value from the fault impedance value initially determined. This initial trigger time value may, as long as it does not change, be compared continuously with the actual time value. If the initial trigger time value is repeatedly not smaller than the actual time value, the connection between the protection element and the network error is preferably maintained, i.e., it is not interrupted by the separation unit or separated from the rest of the energy supply network. If the determined fault impedance value of the network error changes after a certain time span (e.g., of a few milliseconds or seconds) has elapsed due to changed network conditions in the energy supply network, e.g., due to the fact that another protection element present in the network has interrupted its connection to the network error, then due to the changed fault impedance value a changed (selective) trigger time value (the adapted target time) is deduced by the control unit, which time value may be different from the initial trigger time value. The continuous or permanent comparison with the actual time value is then no longer carried out with the initial but with the changed (adapted) trigger time value. It is both conceivable that a greater fault impedance value than the original fault impedance value is determined and a greater trigger time value than the initial trigger time value is deduced thereby, for example. Likewise it is conversely conceivable that a lower fault impedance value and a lower trigger time value are determined. If e.g., due to the change in fault impedance value such a low changed trigger time value is deduced that the trigger time value is now lower (smaller) than the actual time value, the separation unit is instructed by the control unit in particular momentarily to interrupt the connection to the network error (to separate the network error), e.g., by opening the switch element.

The fault impedance value determined may be dependent on the distance of the protection element from the network error, such as e.g., the ground fault or short circuit, or the length of the path to the network error. The fault impedance value may also be dependent on the length and/or the resistance of the infeed path to the protection element. In particular, the further the protection element is away from the network error, the greater the fault impedance value can be. Conversely, the shorter the distance of the protection element from the network error, the smaller the fault impedance can be. The growing impedance as the distance increases can be caused by the fact that the line impedance is greater for a longer connection than in the case of a shorter connection.

The relationship between the fault impedance value and the trigger time value, based on which the trigger time value is deducible from the fault impedance value, may be at least partly linear or non-linear. According to one configuration, a plurality, e.g., two, three, four, five, six or more than six, linear and/or non-linear relationships between the fault impedance value and the trigger time value may be deposited or stored in the control unit or in a storage unit of the protection element connected to the control unit or contained therein. The relationship or the plurality of relationships may be deposited in the form of mathematical functions, tables, function curves or the like. In the case of a plurality of deposited relationships, depending on the network status or the type of energy supply network, a relationship may be determined or selectable from outside by the protection element. To this end e.g., a proportionality factor may also be set for adaptation of the relationship between the fault impedance value and the trigger time value.

By adaptation of the relationship, the protection element may be adapted to different network sections and thus also be used for network sections that have very small differences in the line or supply line impedances. Such small differences can make sense e.g., in the case of main busbars, in which the line lengths can be very short and thus also the differences in the respective impedance can be very small.

According to a further aspect, a meshed energy supply network of a means of transport, in particular of an aircraft, is provided. The meshed energy supply network comprises one or more (e.g., a plurality of) energy generating devices, one or more (e.g., a plurality of) energy consumers, which are each connected to at least one of the one or more energy generating devices (e.g., via one or more lines), and a plurality of protection elements arranged between the one or more energy generating devices and the one or more energy consumers, as they are/have been described herein. The protection elements may all be constructed in the same way.

For the energy supply network any meshed network structure is conceivable, as is a loop network structure also (e.g., a closed loop) as the simplest form of meshing with e.g., two infeeds.

Depending on how far the protection elements are in each case from a network error that has occurred or how high the impedances are on their path to the network errors, different fault impedance values may be determined or measured independently by each protection element and thus also different initial trigger time values can be deduced. The protection element of which the initial trigger time is the first to fall below the actual time value, for example, i.e., the protection element with the lowest initial trigger time value, will be the first to interrupt its connection to the network error. Due to the interruption, the fault impedance values determined periodically, for example, in one, more or all of the protection elements (the remaining protection elements except for the one already switched off) may change, so that one, more or all of the trigger time values may also change accordingly. The protection element with the now lowest changed trigger time value (adapted trigger time value), for example, may e.g., then trigger in turn as soon as the changed trigger time value falls below the actual time value. Thereupon, one, more or all of the remaining fault impedance values of the remaining protection elements and thus also the trigger time value/values may change again.

In this way it is possible to react adaptively to changes in the energy supply network, e.g., to changes brought about by the triggering of protection elements, so that the protection element with the currently lowest trigger time always actually triggers.

The energy supply network may be a meshed network, for example, in which high-impedance faults can occur, such as e.g., a meshed network in an aircraft with carbon-fiber-reinforced plastic fuselage (CFRP). Weight savings are possible, furthermore, with the aid of meshing of the energy supply network.

The method according to the invention for protecting a meshed energy supply network of a means of transport, in particular of an aircraft, has the following steps: deducing a trigger time value from a determined fault impedance value of a network error that has occurred in the energy supply network; adapting the trigger time value in the event of a subsequent change in the fault impedance value of the network error; and interrupting a connection between a protection element and the network error depending on the trigger time value.

The method can further have the following steps: periodically increasing an actual time value following occurrence of the network error; periodically comparing the trigger time value with the actual time value; and interrupting the connection if the trigger time value is smaller than the actual time value. The trigger time value may be deduced from the fault impedance value from a linear or non-linear relationship between the fault impedance value and the trigger time value.

Furthermore, the invention relates to a computer program with program code means, which, when loaded into a computer or a processor (for example a microprocessor or microcontroller), or when it runs on a computer or a processor (e.g., a microprocessor or microcontroller), causes the computer or processor (e.g., the microprocessor or microcontroller) to execute the method described above. In addition, the invention relates to a program storage medium or computer program product with said computer program.

Even if some of the aspects described above were described with reference to the protection element or the energy supply network, these aspects can also be implemented as a method or as a computer program executing the method. Aspects described with reference to the method can be realized by suitable units in the protection element or executed by the computer program in just the same way.

BRIEF DESCRIPTION OF THE DRAWINGS

Preferred embodiments of the present invention are explained below with reference to the enclosed schematic figures. These show:

FIG. 2a a simplified representation of an energy supply network with doubly fed high-impedance fault;

FIG. 2b a simplified representation of an energy supply network with doubly fed low-impedance fault;

DETAILED DESCRIPTION OF THE PREFERRED EMBODIMENTS

Figure 1A:
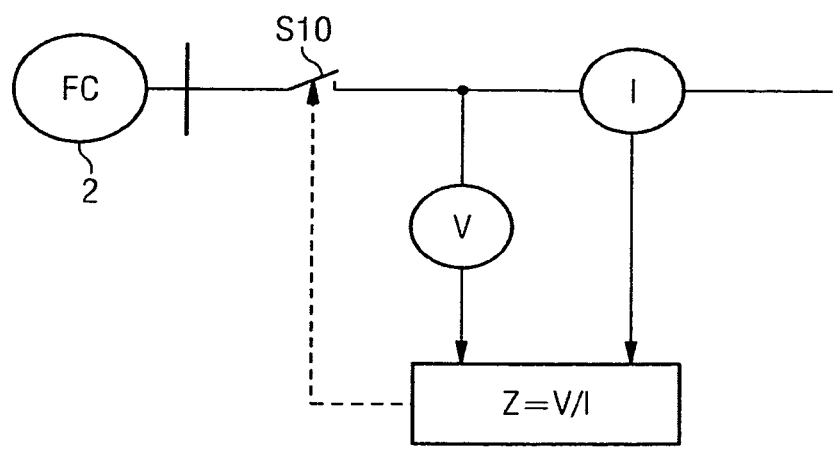
FIG. 1a a schematic representation of the mode of operation of a conventional impedance protection element.
Figure 1B:
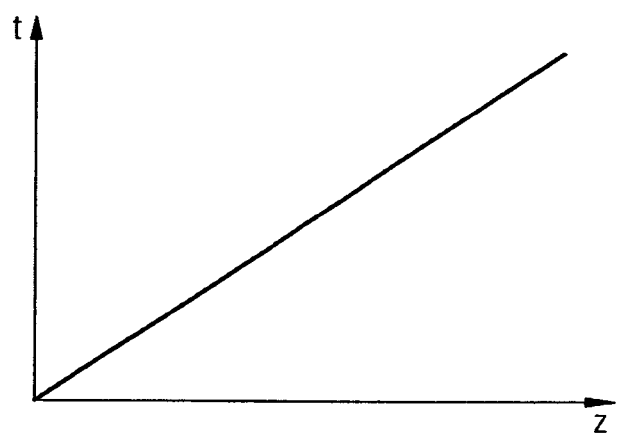
FIG. 1b a schematic representation of the reaction time of the impedance protection element from FIG. 1a as a function of the impedance.

FIGS. 1a and 1b show the mode of operation in principle of a conventional impedance protection element. In FIG. 1a a fuel cell 2 is shown schematically as a generator for generating electrical energy. Even if a fuel cell 2 is shown by way of example in FIG. 1a, any type of generator or any type of energy generating device for generating electrical energy can be used instead of the fuel cell 2. The impedance protection element is shown in FIG. 1a in simplified form as switch S10 and measures both a voltage (represented by V as an abbreviation for the English word "voltage") and a current (represented by I). From the quotient of voltage and current the protection element determines the related impedance Z. This is dependent in this case on the line impedance and the length of the line. The greater the impedance, the greater also the trigger time. This is illustrated in FIG. 1b, which shows the dependence of a trigger time t on the impedance Z. As can be recognized from FIG. 1b, the trigger time t is directly proportional to the impedance Z, i.e., the greater the impedance, the greater also the trigger time, and conversely the smaller the impedance, the smaller also the trigger time. The result of this is that impedance protection elements close to the fault trigger faster due to the small impedance than impedance protection elements remote from the fault. A fault is accordingly separated due to the fact that first the protection element close to the fault opens and on failure of the protection element close to the fault, the further protection elements trigger as the distance increases (if the fault is still present due to the failure of the protection element close to the fault), such as e.g., opening their switch.

FIG. 2a shows a simplified energy supply network schematically, at which a short circuit occurs, indicated by the lightning flash. This is a high-impedance fault (1 ohm). As can be recognized in FIG. 2a, the network error is fed from the right side at a substantially higher impedance (because of the network impedance of 9.9 ohms) than from the left side (network impedance 1.9 ohms). The left protection element S10 accordingly detects a fault impedance of 1.32 ohms (the fault impedance results from the voltage dropping between the protection element S10 and ground and the current flowing through the protection element S10) and sets a related trigger time according to FIG. 1b. The right protection element S20, on the other hand, detects a fault impedance of 5.6 ohms and sets, according to FIG. 1b, a correspondingly higher trigger time. Accordingly, the left protection element S10 triggers first, opens its switch and thereby interrupts its connection to the short circuit. After some time, the protection element S20 finally interrupts its connection to the short circuit at the correspondingly later set trigger time. Since the protection element S20 has detected a fault impedance value that is approximately four times greater, its trigger time is also roughly four times greater than the trigger time of the protection element S10. Further impedance protection elements, which are not shown, with trigger times lying between that of the protection element S10 and of the protection element S20, would trigger in the intervening period before the protection element S20.

FIG. 2b shows a similar situation to FIG. 2a, but with a low-impedance fault (0.01 ohms). In the case of the low-impedance fault, the impedance and thus also the trigger time of the protection element S10 is smaller than the impedance and the trigger time of the protection element S20, but to a smaller extent than in FIG. 2a. The protection element S20 will trigger accordingly shortly after the protection element S10.

Conventional impedance protection elements measure the fault impedance following occurrence of the fault and depending on the fault impedance measured determine a trigger time, which remains unchanged during the overall separation of the network error. This means that every protection element separates the network error according to the established trigger time, regardless of whether network changes are caused by the triggering of the other protection elements.

Figure 3:
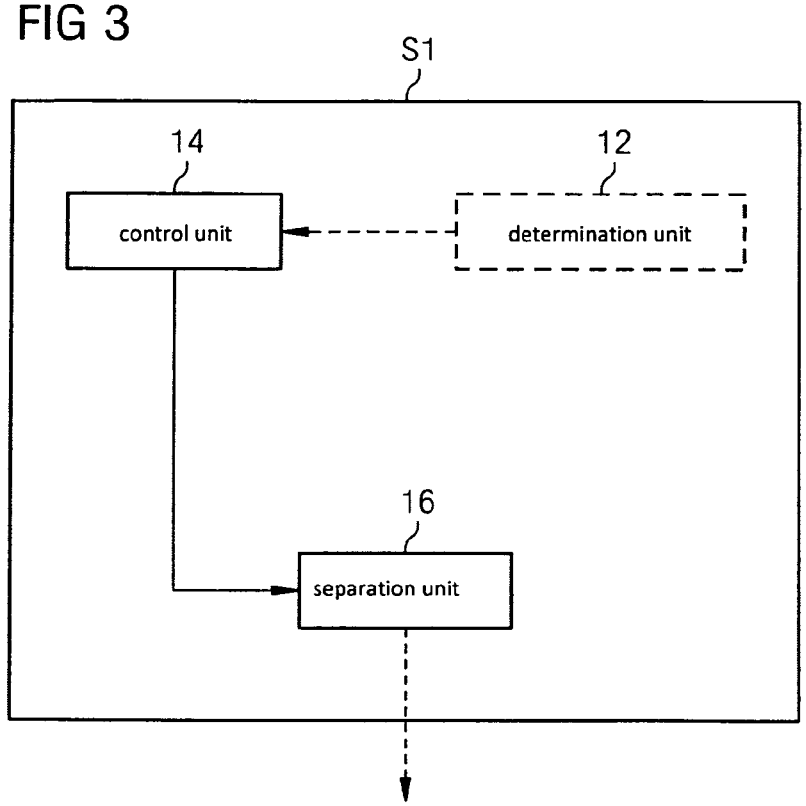
FIG. 3 a schematic representation of a protection element according to a first embodiment.

FIG. 3 shows schematically a protection element S1 according to a first embodiment. The protection element S1 has a control unit 14 and a separation unit 16. Furthermore, the protection element S1 may additionally have a determination unit 12, as indicated by the dashed lines. The determination unit 12 may also be provided outside the protection element S1, however, and supply the protection element S1 with the information ascertained. The mode of operation of the protection element S1 is to be described further with reference to the following figures.

Figure 4:
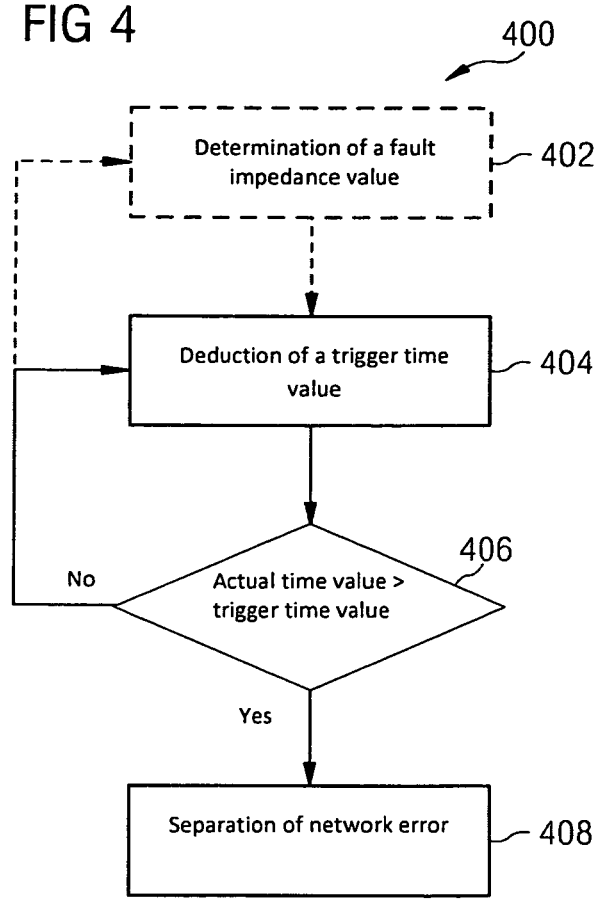
FIG. 4 a flow chart of a method for protecting energy supply networks of a first embodiment.

FIG. 4 shows a flow chart, which illustrates a method according to a first embodiment. The step 402 is to be regarded as optional and may also be omitted, as indicated by the dashed lines. In step 402, a fault impedance value that has occurred due to a recognized network error, such as a short circuit or ground fault, may be determined with the aid of the determination unit 12. To this end, as explained with regard to FIGS. 1a and 1b, the determination unit 12 or a measuring unit present in the determination unit 12 or connected to the determination unit 12 may measure a voltage and a current of the network error. The determination unit 12 may then determine the fault impedance from the quotient of voltage and current. The measured or determined fault impedance may be forwarded by the determination unit 12 to the control unit 14.

In step 404, the control unit 14 deduces the related trigger time (the related trigger time value) for the protection element S1 from the fault impedance determined. This can take place, for example, with reference to a curve shown in FIG. 7, which is yet to be explained below. The trigger time value indicates the time at which the protection element S1 is to trigger, i.e., is to separate the fault. For this purpose the control unit 14 compares the trigger time value with an actual time value periodically, e.g., every 0.1 milliseconds (step 406). Immediately following fault detection, the actual time value is incremented periodically by the control unit 14, e.g., also in steps of 0.1 milliseconds. Using the same period, e.g., of 0.1 milliseconds, the actual time value is compared with the trigger time value in step 406. If it is determined in step 406 that the actual time value is greater than the trigger time value, the switch element S1 triggers. The control unit 14 passes a trigger signal to the separation unit 16 to this effect, which interrupts the connection to the network error (step 408) in reaction to the trigger signal. The separation unit 16 may be formed as a simple electromechanical or electronic switch. If it is determined in step 406, however, that the actual time value is not greater than the trigger time value, the method is executed again. The period of the renewed method execution may be coordinated to the period of incrementing of the actual time value and of the comparison of actual time value and trigger time value.

If the step 402 is present in the method from FIG. 4, the method begins again with the determination of a fault impedance value (or else with the step 404). If e.g., another protection element present in the energy supply network has determined that its initially set trigger time is smaller than the actual time value (which is preferably of the same magnitude in every protection element in the network), the other protection element has interrupted its connection to the network error. This separation of the other protection element can lead to the protection element S1 determining a changed impedance value following the switch-off of the other protection element in step 402 than before the switch-off of the other protection element. The changed fault impedance value, which is now determined in step 402, leads to a changed trigger time value being deduced from the fault impedance value in step 404. The changed trigger time value in step 406 can accordingly be smaller than the actual time value that now applies, although the initial trigger time value had been greater. If the changed trigger time value is actually smaller than the actual time value in step 406, the network error is separated in step 408. Alternatively, the method is executed again and the actual time value increased as long as the fault is present.

Figure 5:
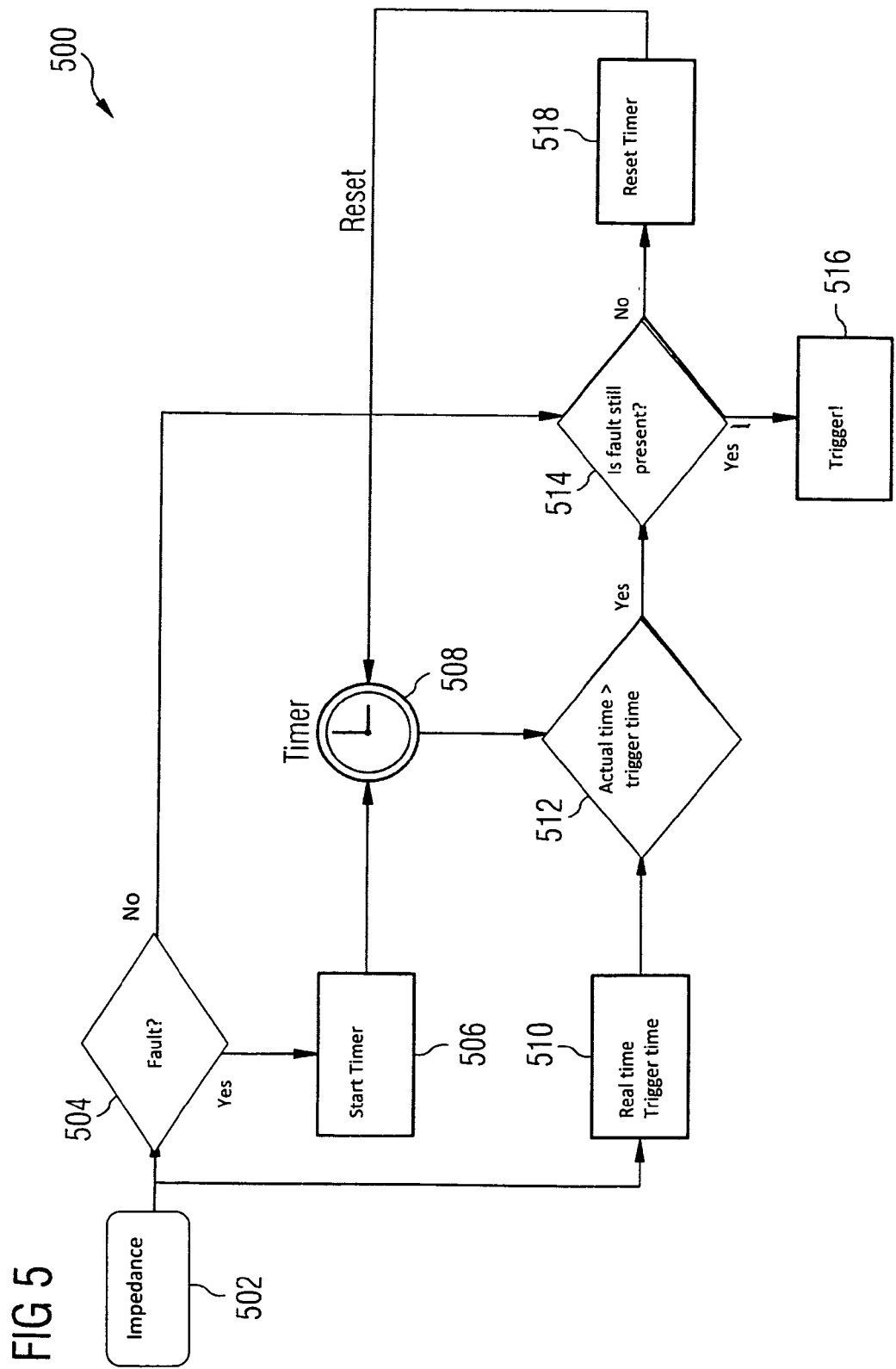
FIG. 5 a flow chart of a method for protecting energy supply networks according to a second embodiment.

FIG. 5 shows a method according to a second embodiment (for fault separation of a network error). First the fault impedance is determined, as described earlier, in step 502. In step 504, it is checked e.g., by comparison of the fault impedance value with a preset threshold value whether a fault is present. If a fault is detected, a timer is instructed in step 506 to start an actual time value, which is incremented at periodic intervals in step 508. At the same time as the timer is started, the trigger time of the protection element S1 is determined from the determined fault impedance in step 510. In step 512 the actual time value is compared with the trigger time value. If it is established in step 512 that the actual time value is not greater than the trigger time value, the method in step 502 starts again. If the actual time value is greater than the trigger time value, on the other hand, it is queried in step 514 whether the fault is still present. If it is determined in step 514 that the fault is still present, the protection element S1 is triggered in step 516. If it is determined on the other hand in step 514 that the fault is no longer present, the time is reset in step 518.

Figure 6:
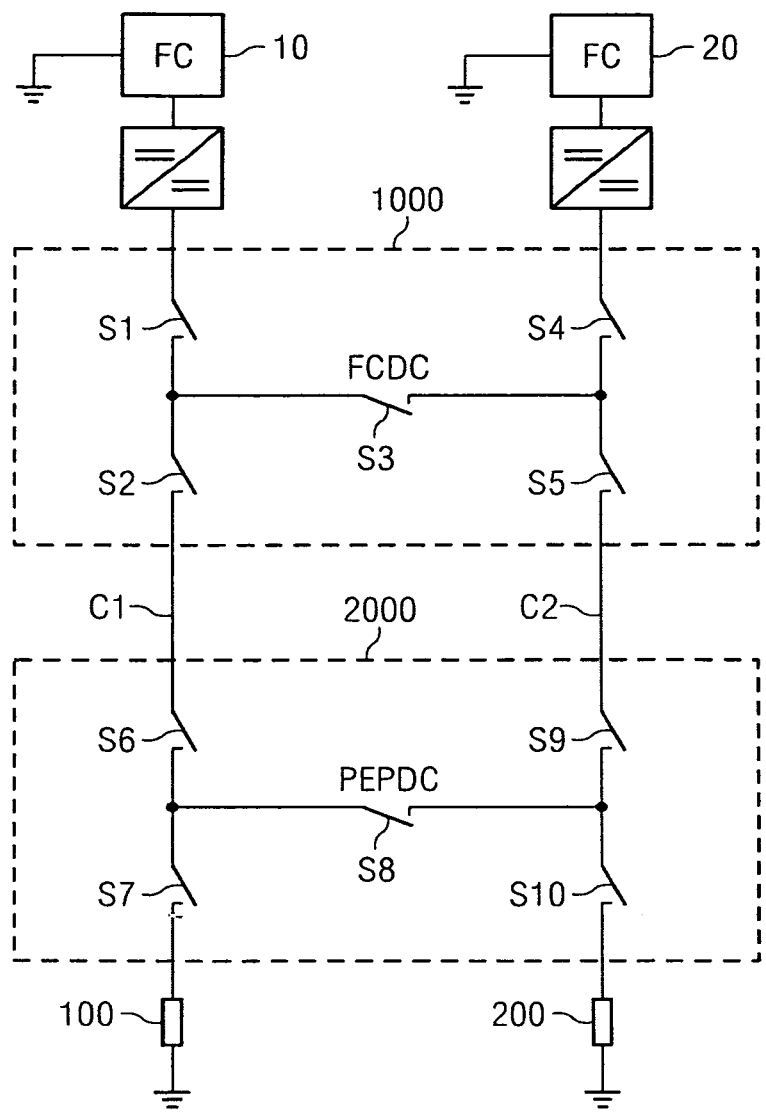
FIG. 6 a schematic representation of a meshed energy supply network with several protection elements.

FIG. 6 shows schematically a meshed energy supply network. In the energy supply network, two generators 10, 20 are arranged by way of example. The number of generators 10, 20 shown should be understood as purely exemplary and any number of generators may be arranged in the energy supply network. Likewise, the generators 10, 20 in FIG. 6 are formed by way of example as fuel cells (FC), but are not limited to this, but can be formed as any kind of energy generating devices. Two busbar systems 1000, 2000 are present in the energy supply network, namely a primary electrical power distribution centre (PEPDC) 2000 and a fuel cell distribution centre (FCDC) 1000. Five protection elements S1, S2, S3, S4, S5 are arranged in the FCDC 1000 by way of example. This number should be understood to be purely exemplary and any number of protection elements can be arranged in the FCDC 1000. Likewise, five protection elements S6, S7, S8, S9, S10 are arranged by way of example in the PEPDC 2000, but any number of protection elements can be arranged in the PEPDC 2000. All protection elements are preferably formed in the same manner as the protection element S1 shown in FIG. 3. The FCDC 1000 and the PEPDC 2000 are connected to one another via two lines C1, C2. Network errors, such as ground faults or short circuits, can occur in these lines C1, C2. Furthermore, two loads 100, 200 are connected to the PEPDC 2000 as electrical consumers, but any number of loads can be arranged in the energy supply network. The mode of operation of the energy supply network is explained with reference to FIGS. 8 and 9.

Figure 7:
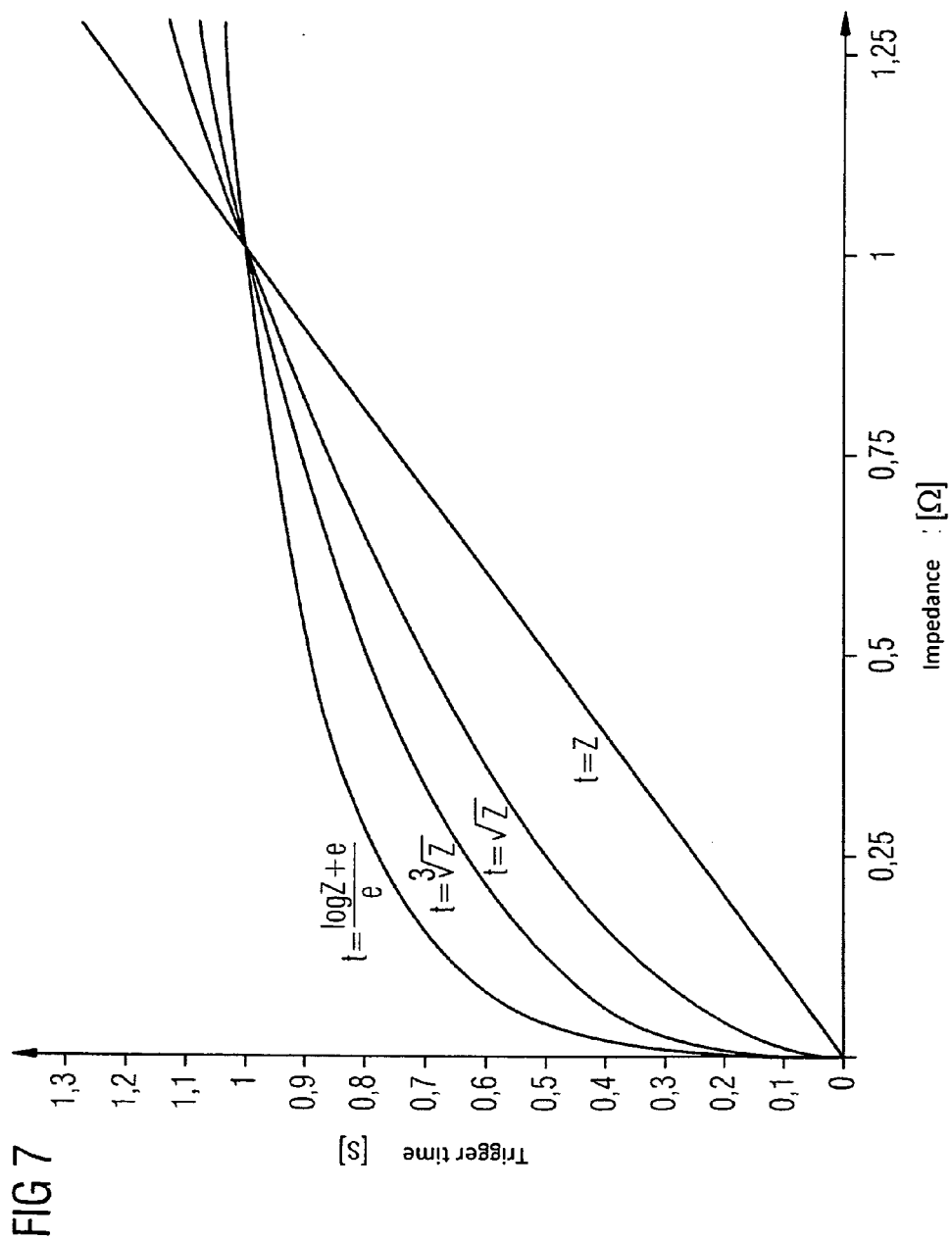
FIG. 7 a schematic representation of the dependencies of trigger times and impedance.

Four different curves are shown in FIG. 7, which represent the relationship between measured/determined impedance/fault impedance and set trigger time. These curves can be selected flexibly by the control unit 12 of the protection element or one of the curves can be preset. In this case e.g., the network topology can be taken into consideration in the selection or the presetting. As can be seen in FIG. 4, one curve indicates a linear correlation between the impedance and the trigger time value, while the three other curves indicate a non-linear correlation, such as a logarithmic correlation. It is specified for all curves that an impedance of one ohm leads to a trigger time of one second, i.e., all curves intersect at this one point (x=1Ω; y=1s). The curves can be adapted with the aid of an adjustable prefactor or proportionality factor. This proportionality factor may determine the relationships between trigger time and impedance represented in FIG. 7.

Due to the choice of the different curves, it can be guaranteed that even network sections that have very small differences in the supply line impedances can be equipped with impedance protection. This can be sensible, for example, when protecting the main busbars. The line lengths here are very short and thus the differences in impedance very small.

Figure 8:
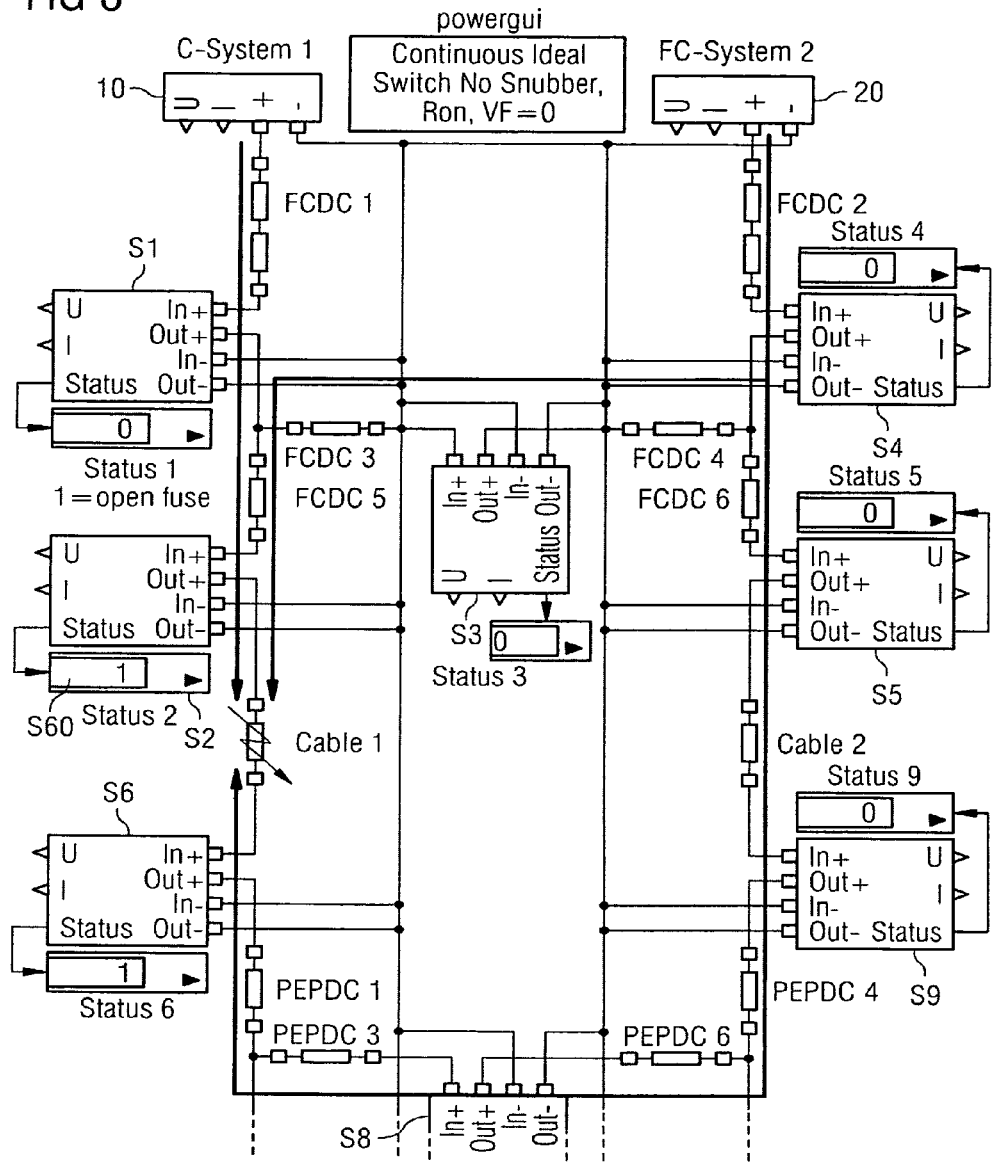
FIG. 8 a section of the energy supply network from FIG. 6.

FIG. 8 shows a section from FIG. 6, in which a network error has occurred in the line C1. As indicated by the thickness of the arrows in FIG. 8, the greatest current flows through the path from the generator 10, via the protection element S1 and the protection element S2, as this path has the smallest line impedance, i.e., the smallest resistance, on account of its shortest length. The smallest current flows from the generator 20 via the protection elements S4, S5, S9, S8 and S6. This path is the longest to the network error and thus has the highest line impedance. Another portion of the current from the generator 20 flows via the protection element S4 to the protection element S3 and finally via the protection element S2 to the network error. The reaction of the protection elements to the network error is now described with reference to FIGS. 8 and 9.

Figure 9:
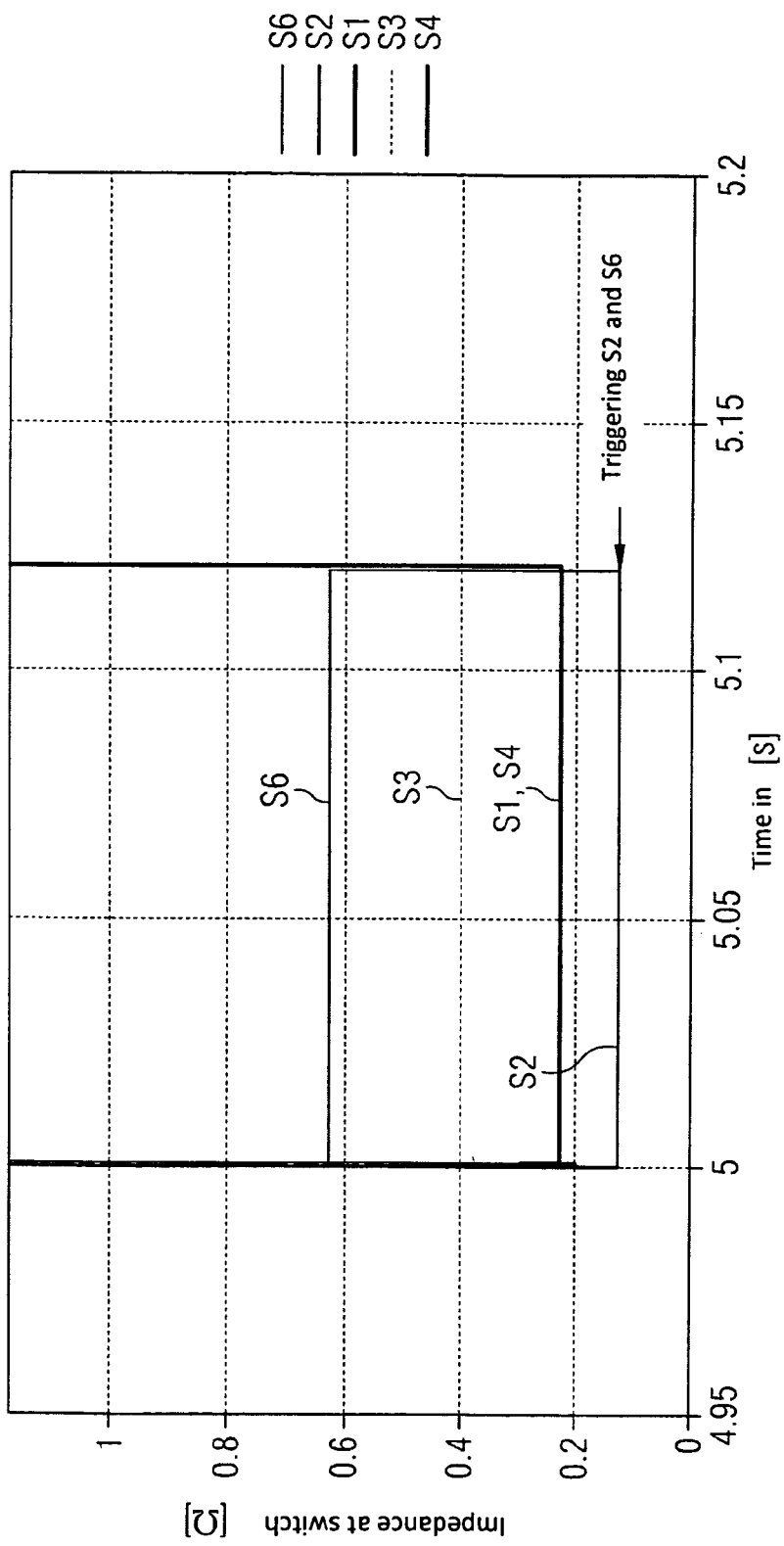
FIG. 9 a schematic curve of protection element impedances.

Assumed by way of example, a high-impedance ground contact (0.1 ohms) occurs on the cable section C1 between the two busbars 1000, 2000 at t equals five seconds. The earth impedance is greater here than the corresponding line impedances. A proportionality factor of 1 is likewise assumed by way of example, i.e., from FIG. 7 the control unit 14 of the protection element S1 selects the linear relationship between impedance and trigger time value. In FIG. 9, the impedance curves of all protection elements affected, i.e., the protection elements S1, S2, S3, S4 and S6 are shown. It can be seen that the protection element S2 initially measures the smallest impedance (0.12 ohms) at t equals five seconds. The smallest trigger time of 0.12 s is thus determined for the protection element S2 (due to the linear relationship between impedance and trigger time), so that this triggers fastest, namely after 5.12 seconds. The protection element S6 initially measures the greatest impedance and would trigger at the latest due to the greatest trigger waiting time in a conventional distance protection system. However, the following happens in the supply network if protection elements according to FIG. 3 are used, which operate according to one of the methods from FIGS. 4 and 5.

To begin with, the protection element S2 measures the smallest impedance due to its shortest distance (as said before, the line impedance is smallest from the generator 10 via the protection element S1 and the protection element S2). The protection element S2 measures an impedance of 0.12 ohms, which corresponds to a trigger time value of 0.12 seconds according to the curve from FIG. 7 with a proportionality factor of 1. On the other hand, the protection element S6 measures an impedance value of more than 0.6 ohms due to the high line impedance and would trigger accordingly only after more than 0.6 seconds. The other protection elements S1, S3, S4 measure impedance values lying in between (impedance values between 0.2 and 0.4 ohms) and would accordingly trigger earlier than the protection element S6 but later than the protection element S2. If the protection element S2 now triggers, which is also made clear by the status value 1 in the status storage S60 (the status 0 corresponds to the closed state of the protection element and the status 1 to the open state of the protection element), no more current can flow through this to the network error due to the triggered (opened) protection element S2. The impedance values of the protection elements S1, S3 and S4 jump up thereby, while the impedance value of the protection element S6 falls to 0.12 ohms (the path from the generator 20 via the protection elements S4, S5, S9, S8, S6 to the cable C1 can now be flowed through with the smallest line impedance). The trigger time shortens thereby to 0.12 seconds and is suddenly smaller than the actual time value. The protection element S6 thus also opens at least virtually simultaneously with the protection element S2 (status 1=open) and the network error is quickly separated.

Faults can be rectified quickly with this method. In the conventional method, the protection elements S1 or S4 would have the next highest trigger time. Since the fault is still present following the switching of S2, S4 would likewise switch. Even after switching of protection element S4, the fault can continue to be fed via the protection elements S1 and S3, so that these two protection elements would also trigger in a staggered manner. Thus the entire network would be switched off and no fault separation would have taken place.

Using the method according to FIGS. 4 and 5 and the related protection element according to FIG. 3, the network error from FIG. 8 can quickly be separated.

Figure 10:
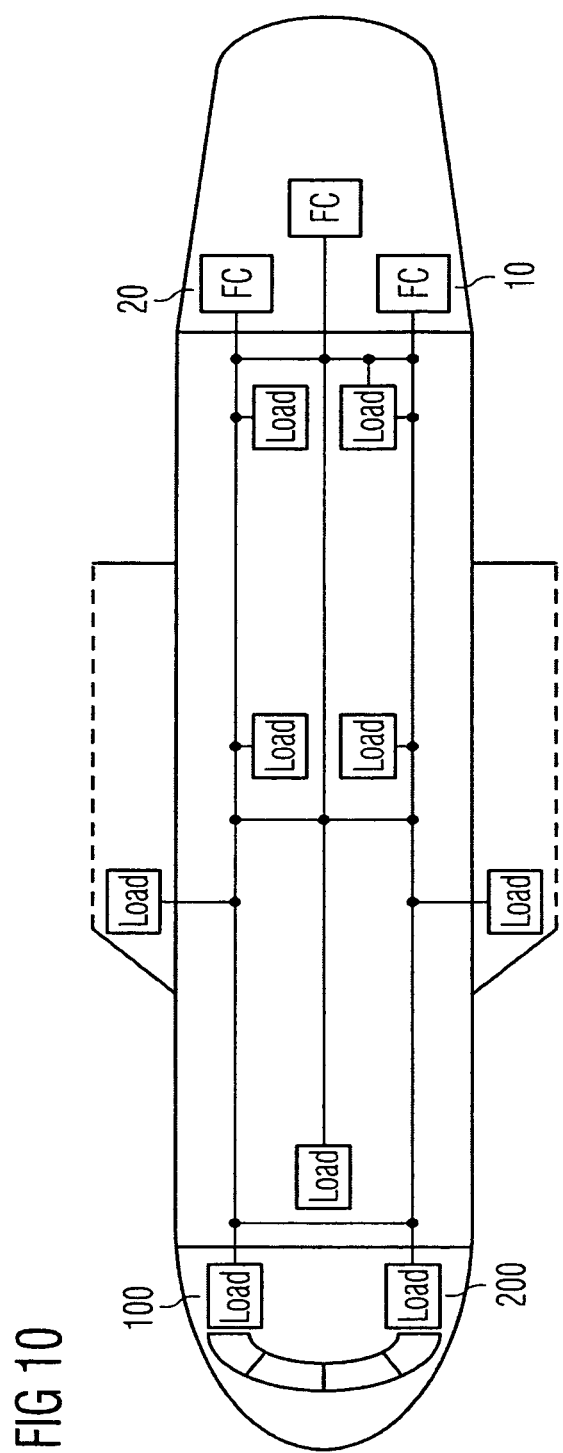
FIG. 10 a schematic representation of a meshed energy supply network on board an aircraft.

FIG. 10 shows finally in schematic form a meshed on-board network with several infeeds 10, 20 on board an aircraft. Here too several loads (e.g., loads 100, 200) are arranged as consumers by way of example. As shown by way of example in FIGS. 6 and 8, protection elements S1 from FIG. 3 can be arranged in the meshed on-board network.

The fuselage of the aircraft shown in FIG. 10 can be a carbon-fiber-reinforced plastic fuselage (CFRP fuselage), in which the ground is realized by a network with electrical structure (e.g., an electrical structure network (ESN)). This structure can often not supply any low-impedance ground, i.e., the ground impedance is usually great. Due to weight optimizations, only little electrically conductive material is incorporated into the structure in these fuselages (in contrast to aluminum fuselages).

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

The invention claimed is:

1. A protection element for a meshed energy supply network of a means of transport, comprising:
    a control unit, adapted to deduce a trigger time value from a determined fault impedance value of a network error that has occurred in the energy supply network and to adapt the trigger time value in the event of a subsequent change in the fault impedance value of the network error; and
    a separation unit for interrupting a connection between the protection element and the network error depending on the trigger time value,
    wherein the control unit is further adapted to increment an actual time value periodically following occurrence of the network error, to compare the trigger time value periodically with the actual time value, and to instruct the separation unit to interrupt the connection if the trigger time value is smaller than the actual time value.

2. The protection element according to claim 1, wherein the control unit is further configured to adapt the trigger time value and compare it periodically with the actual time value in the event of a subsequent change in the fault impedance value of the network error until one of the trigger time value is smaller than the actual time value and the network error is no longer present.

3. The protection element according to claim 1, wherein the protection element further comprises a determination unit, which is adapted to determine the fault impedance value of the network error from a voltage present at the protection element and a current flowing through the protection element.

4. The protection element according to claim 1, wherein the determined fault impedance value is dependent on the distance of the protection element from the network error.

5. The protection element according to claim 1, wherein the control unit is further adapted to deduce the trigger time value from the fault impedance value from a one of a linear and non-linear relationship between the fault impedance value and the trigger time value.

6. The protection element according to claim 5, wherein a proportionality factor is set for adapting the relationship between the fault impedance value and the trigger time value in the control unit.

7. The protection element according to claim 1, wherein the control unit is further adapted to reset the actual time value if no further network error is detected.

8. The protection element according to claim 1, wherein the control unit has a microprocessor.

9. A meshed energy supply network of a means of transport, comprising:
    one or more energy generating devices for generating electrical energy;
    one or more energy consumers, which are each connected to at least one of the one or more energy generating devices; and
    a plurality of protection elements comprising a control unit, adapted to deduce a trigger time value from a determined fault impedance value of a network error that has occurred in the energy supply network and to adapt the trigger time value in the event of a subsequent change in the fault impedance value of the network error, and a separation unit for interrupting a connection between the protection element and the network error depending on the trigger time value arranged between the one or more energy generating devices and the one or more energy consumers,
    wherein the control unit is further adapted to increment an actual time value periodically following occurrence of the network error, to compare the trigger time value periodically with the actual time value, and to instruct the separation unit to interrupt the connection if the trigger time value is smaller than the actual time value.

10. A method for protecting a meshed energy supply network of a means of transport, comprising the following steps:
    deducing a trigger time value from a determined fault impedance value of a network error that has occurred in the energy supply network;
    adapting the trigger time value in the event of a subsequent change in the fault impedance value of the network error;
    periodically incrementing an actual time value following occurrence of the network error;
    periodically comparing the trigger time value with the actual time value; and interrupting a connection between a protection element and the network error if the trigger time value is smaller than the actual time value.

11. The method according to claim 10, wherein the trigger time value is deduced from the fault impedance value from one of a linear and non-linear relationship between the fault impedance value and the trigger time value.

12. A computer program with a program code, which, when loaded into a computer or processor or when running on a computer or processor, causes the computer or processor to execute a method according to claim 10.

13. A non-transitory program storage medium or computer program product with the computer program according to claim 12.

14. A protection element for a meshed energy supply network of a means of transport, comprising:
 a control unit, adapted to deduce a trigger time value from a determined fault impedance value of a network error that has occurred in the energy supply network and to adapt the trigger time value in the event of a subsequent change in the fault impedance value of the network error; and a separation unit for interrupting a connection between the protection element and the network error depending on the trigger time value, wherein the control unit is further adapted to deduce the trigger time value from the fault impedance value from a one of a linear and non-linear relationship between the fault impedance value and the trigger time value, and wherein a proportionality factor is set for adapting the relationship between the fault impedance value and the trigger time value in the control unit.

* * * * *